(12) United States Patent
Tsubone

(10) Patent No.: US 8,569,609 B2
(45) Date of Patent: Oct. 29, 2013

(54) ELECTRIC GENERATION SYSTEM

(75) Inventor: Kenji Tsubone, Susono (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 992 days.

(21) Appl. No.: 11/989,318

(22) PCT Filed: Jul. 24, 2006

(86) PCT No.: PCT/JP2006/314555
§ 371 (c)(1),
(2), (4) Date: Jan. 24, 2008

(87) PCT Pub. No.: WO2007/013389
PCT Pub. Date: Feb. 1, 2007

(65) Prior Publication Data
US 2009/0266394 A1  Oct. 29, 2009

(30) Foreign Application Priority Data

Jul. 25, 2005 (JP) .................................. 2005-214717

(51) Int. Cl.
*H01L 35/00* (2006.01)
(52) U.S. Cl.
USPC ........................................................ 136/206
(58) Field of Classification Search
USPC ........................................................ 136/206
See application file for complete search history.

(56) References Cited

U.S. PATENT DOCUMENTS

| 4,020,368 | A |   | 4/1977  | Carney |
| 4,889,413 | A | * | 12/1989 | Ormsby et al. ............... 359/241 |
| 5,390,045 | A |   | 2/1995  | Bernard, Jr. |
| 5,587,828 | A |   | 12/1996 | Bernard, Jr. |
| 6,055,089 | A | * | 4/2000  | Schulz et al. ................. 359/270 |
| 6,178,034 | B1 | * | 1/2001 | Allemand et al. ............ 359/265 |
| 7,360,306 | B2 |   | 4/2008 | Boehm et al. |
| 2003/0221717 | A1 | * | 12/2003 | Dessel ......................... 136/206 |

(Continued)

FOREIGN PATENT DOCUMENTS

| EP | 1 493 557 | 1/2005 |
| JP | 01-216580 | 8/1989 |

(Continued)

OTHER PUBLICATIONS

Machine Translation Yamashita (JP 2001135868) retrieved Jan. 21, 2011.*

(Continued)

*Primary Examiner* — Jennifer Michener
*Assistant Examiner* — Shannon Gardner
(74) *Attorney, Agent, or Firm* — Finnegan, Henderson, Farabow, Garrett & Dunner, LLP

(57) ABSTRACT

To utilize solar energy without loosing the laminating function. For this purpose, there is provided an electric generation system for generating an electric power utilizing solar energy falling on a transparent plate 7 dividing a predetermined interior space 8 from an exterior space, characterized in that the transparent plate 7 is provided with a thin plate-like or film-like thermal generation module 11, which is transmissive to at least a portion of visible rays in the solar energy, and which generates an electromotive force by a temperature difference between a temperature in the interior space and a temperature in the exterior space. Consequently, electric power can be generated utilizing heat resulting from blocking the light entering into the interior space 8.

12 Claims, 13 Drawing Sheets

(56) References Cited

U.S. PATENT DOCUMENTS

| | | |
|---|---|---|
| 2004/0076015 A1 | 4/2004 | Aoki et al. |
| 2005/0001456 A1 | 1/2005 | Bohm et al. |
| 2008/0150327 A1 | 6/2008 | Boehm et al. |

FOREIGN PATENT DOCUMENTS

| | | |
|---|---|---|
| JP | 07-142750 | 6/1995 |
| JP | 2000-104464 | 4/2000 |
| JP | 2001-053322 | 2/2001 |
| JP | 2001-135868 | 5/2001 |
| JP | 2003-154845 | 5/2003 |
| JP | 2004-114900 | 4/2004 |
| JP | 2004-169358 | 6/2004 |
| JP | 2005-007920 | 1/2005 |

OTHER PUBLICATIONS

Machine Translation Kujirada (JP 2000104464) retrieved Jan. 21, 2011.*
Notification of the First Office Action for Chinese Appl. No. 200680027130.8 dated Apr. 14, 2010.
Extended European search Report from the European Patent Office for EP Appln. No. 06781477.2, dated Aug. 10, 2009.
International Search Report.

* cited by examiner

ELECTRIC GENERATION SYSTEM

TECHNICAL FIELD

This invention relates to an electric generation system adapted to generate electric power by energy from the sun, and more specifically, to a system for generating electric power utilizing solar power falling on a transparent plate such as a glass.

BACKGROUND ART

Solar light contains rays of various wavelengths such as ultraviolet rays, visible rays, infrared rays and so on. Since the wavelength of ultraviolet ray is short and an energy thereof is high, in the prior art, the ultraviolet ray has been recovered as an electric power by a solar cell as a photovoltaic element. Also, since infrared ray in the solar light is a heat ray, it can be utilized as a heat source. For example, according to an invention taught by Japanese Patent Laid-Open No. 2001-53322, a thermoelectric element is arranged underneath a solar cell, and a thermal electric generation is carried out in addition to a photovoltaic generation by cooling a lower part of the thermoelectric element by cooling means.

Meanwhile, because solar light contains heat rays as explained above, a cooling effect is degraded if the heat rays enter in a room or in a passenger compartment of a vehicle. Therefore, according to a cabin temperature rise restricting device for a vehicle taught by Japanese Patent Laid-Open No. 2004-114900, sun beams are shielded by a light control glass and by closing a sunshade according to an outer temperature, an amount of solar radiation, or a position of the sun measured by a navigation system.

According to the invention disclosed in the above-mentioned Japanese Patent Laid-Open No. 2001-53322, cooling means has to be arranged in the system for the purpose of cooling the underside of the thermoelectric element. Therefore, and the solar light is shaded by the cooling means. This means that this system is assumed to be unsuitable for a window glass guiding a light into a room. Thus, this system has to be improved in this point.

On the other hand, the invention disclosed in Japanese Patent Laid-Open No. 2004-114900 is capable of shading or reducing solar radiation disturbing or degrading air conditioning efficiency. However, since the solar energy is shaded, the energy cannot be recovered and utilized. Thus, this system also has to be improved to utilize clean and natural energy effectively.

DISCLOSURE OF THE INVENTION

The present invention has been conceived noting the technical problems thus far described, and its object is to provide an electric generation system, which is capable of utilizing solar energy effectively without losing a lighting function of solar light.

In order to achieve the above-mentioned object, according to the present invention, there is provided an electric generation system for generating an electric power utilizing solar energy falling on a transparent plate dividing a predetermined interior space from an exterior space, wherein the transparent plate is provided with a thin plate-like or film-like thermal generation module, which is transmissive to at least a portion of visible rays in the solar energy, and which generates an electromotive force according to a temperature difference between a temperature in the interior space and a temperature in the exterior space.

According to the electric generation system of the invention, the transparent plate is provided with a thin plate-like or film-like photochromic material capable of changing an amount of light transmitting therethrough, in addition to the thermal generation module.

In addition to above, the electric generation system of the invention further comprises a control means for reducing the amount of light transmitting through the photochromic material in case a quantity of the visible rays is large, in comparison with the amount of the light transmitting through the photochromic material of the case in which the quantity of the visible rays is small.

According to another aspect of the invention, there is provided an electric generation system for generating an electric power utilizing solar energy falling on a glass window dividing a vehicle interior from a vehicle exterior, wherein the glass window comprises: a thin plate-like or film-like photochromic material capable of changing an amount of light transmitting therethrough; and a thin plate-like or film-like thermal generation module, which is transmissive to at least a portion of visible rays in the solar energy, which generates an electromotive force according to a temperature difference between a temperature in the vehicle and a temperature outside of the vehicle, and which is capable of transferring heat with the photochromic material. The electric generation system further comprises a control means for controlling the amount of light transmitting through the photochromic material on the basis of a running condition of the vehicle.

The running condition of the vehicle includes at least any of: a vehicle speed; an amount of solar radiation on the vehicle; a running mode such as a forward running and a backward running; a shifting mode for selecting a range of speed change ratios of the vehicle; a driving environment stored in advance and a position of the vehicle; and a driving environment transmitted from outside.

Also, the photochromic material includes a light control glass capable of controlling a rate of heat ray absorption, and the control means is adapted to reduce the amount of the light transmitting through photochromic material by increasing the rate of heat ray absorption.

According to the invention, the photochromic material includes a light control glass as a light reflection layer, in which a reflectance against heat ray is controllable, and which is arranged on a side of the transparent plate or the glass window opposite to a side from which the solar light enters, and the control means is adapted to reduce the amount of light transmitting through the photochromic material by increasing the reflectance against heat ray.

In addition to above, according to the electric generation system of the invention, the photochromic material is connected with one of interior and exterior faces of the thermal generation module where the temperature is higher than the other face in a heat transmittable manner, and the thermal generation module is adapted to generate an electromotive force according to a temperature difference between a temperature in the photochromic material side and a temperature in the opposite side.

According to the invention, the transparent plate or the glass window further comprises a thin plate-like or film-like photovoltaic generation module generating an electromotive force by a photoelectric conversion achieved by receiving solar light.

In addition to above, the photovoltaic generation module is connected with the photochromic material in a heat transmittable manner.

Moreover, the electric generation system of the invention further comprises a means for increasing an amount of light transmitted through the photochromic material in case a temperature of the photovoltaic generation module is high, in comparison with that of the case in which the temperature of the photovoltaic generation module is low.

As explained above, according to the invention, the thin plate-like or film-like thermal electric generation module, which is capable of transmitting at least a portion of visible rays therethrough, is attached to the transparent plate dividing the interior space from the exterior space. Therefore, the solar light can be used as a light source for the interior space, and the solar energy can be recovered as an electric power generated as a result of heating the thermal generation module by the heat rays in the solar light.

Also, according to the invention, the amount of the light penetrating into the interior space can be controlled by the photochromic material attached to the transparent plate. Therefore, in case of cooling the interior space, for example, a cooling efficiency can be improved by reducing the amount of the light penetrating into the interior space. At the same time, an output of the thermal generation module can be increased utilizing heat generated as a result of blocking a part of the solar light by the photochromic material. For this reason, thermal efficiency can be improved entirely in case of cooling the interior space.

According to the invention, in case the amount of the visible rays is large, e.g., in a daytime, the control means carries out the control to reduce the amount of light transmitting through the photochromic material. In this case, the amount of the visible rays entering into the interior space is relatively reduced, however, the amount of the visible rays falling on the transparent plate is entirely large. For this reason, in case of cooling the interior space, negative factors to degrade the cooling efficiency can be reduced without losing visibility from the interior space to the exterior space. Moreover, since the thermal generation module generates electric power utilizing the heat converted from a portion of the lights blocked by the photochromic material, a recovery efficiency of the solar energy can be improved.

As explained above, according to the invention, the amount of light transmitting through the glass window dividing the vehicle interior from the vehicle exterior is controlled by the control means, and the thermal generation module generates electric power utilizing the heat of the glass window. Additionally, the amount of transmitting light is controlled based on a running condition of the vehicle. For this reason, in case the amount of solar radiation is large, for example, the cooling efficiency in the interior space can be improved by reducing the amount of the transmitting light, and the electric power can be generated at the same time by the thermal generation module utilizing the heat of the glass window converted from the partially blocked solar light. As a result, the energy efficiency can be improved entirely.

Also, as explained above, the running condition of the vehicle includes at least any of the various information, the energy recovery can be carried out efficiently in accordance with the circumstances surrounding the vehicle such as temperature or weather, and the visibility from the interior space of the vehicle can also be ensured.

According to the invention, the light control glass absorbs solar lights in case of reducing the amount of light transmitting therethrough. As a result, the temperature of the light control glass is raised and the thermal generation module generates electric power utilizing the generated heat. For this reason, the solar energy can be recovered and utilized effectively.

According to the invention, the cooling efficiency in the interior space of the vehicle can be improved by increasing the reflectance ratio against the heat rays to reduce the amount of the heat rays penetrating into the interior space of the vehicle. At the same time, the thermal generation module can generate electric power utilizing the heat accumulated in the light control glass. Thus, the solar energy can be recovered and utilized effectively.

In case the photochromic material blocks at least a part of the solar light, the blocked light is converted into heat in the photochromic material. Consequently, the temperature of the photochromic material is raised. According to the invention, one of the faces of the thermal generation module is connected with the photochromic material in a heat transmittable manner. Therefore, the thermal generation module generates electric power according to a temperature difference between a temperature in the photochromic material side and a temperature in the opposite side as a cooled side. Here, the cooled side of the thermal generation module may be situated in either (vehicle) interior or (vehicle) exterior side according to the situation. For this reason, the solar energy can be utilized efficiently by recovering the solar energy utilizing a heat generation resulting from the light controlling operation of the photochromic material.

Additionally, the photovoltaic generation module generates the electric power by a photoelectric conversion utilizing solar light. According to the invention, therefore, not only thermal energy but also light energy can be effectively recovered to be utilized.

According to the invention, moreover, in case the photovoltaic generation module generates heat as a result of the photoelectric conversion, the generated heat is transmitted to the photochromic material, and the thermal generation module generates electric power utilizing the heat of the photochromic material. For this reason, an amount of heat to be emitted to the outside is reduced. This means that the energy recovery efficiency can be improved entirely.

Further, according to the invention, in case the temperature of the photovoltaic generation module is high, the amount of light transmitting therethrough is relatively increased. Therefore, an excessive temperature rise in the photovoltaic generation module can be prevented so that the photovoltaic generation module can be set to an optimum temperature to generate electric power efficiently. In addition to above, breakage of individual generation modules receiving the heat from the photochromic material and deterioration in durability thereof can also be prevented. As a result, the power generation efficiency is improved.

BEST MODE FOR CARRYING OUT THE INVENTION

Figure 2:
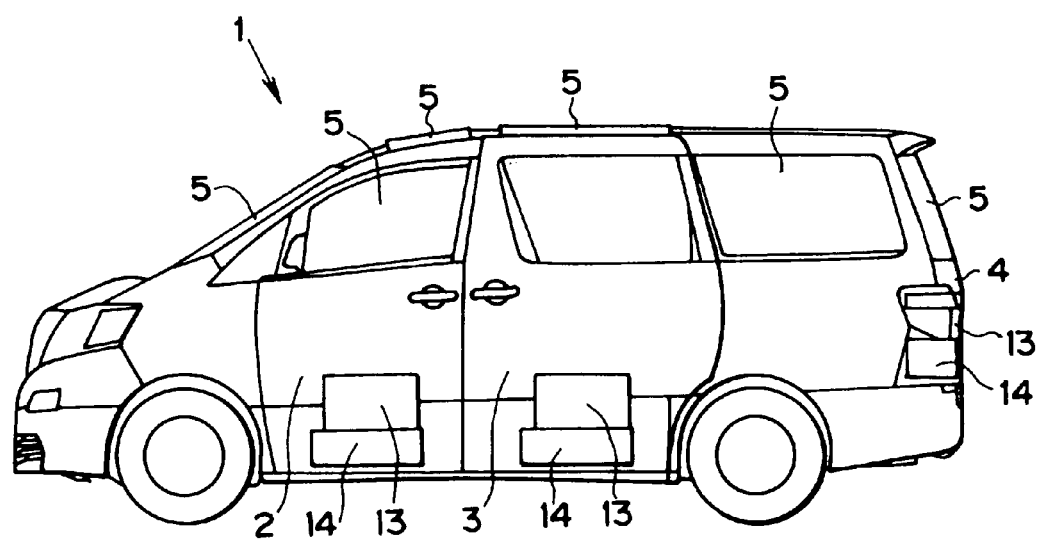
FIG. 2 is a side view showing one example of a vehicle to which the invention is applied.
Figure 3:
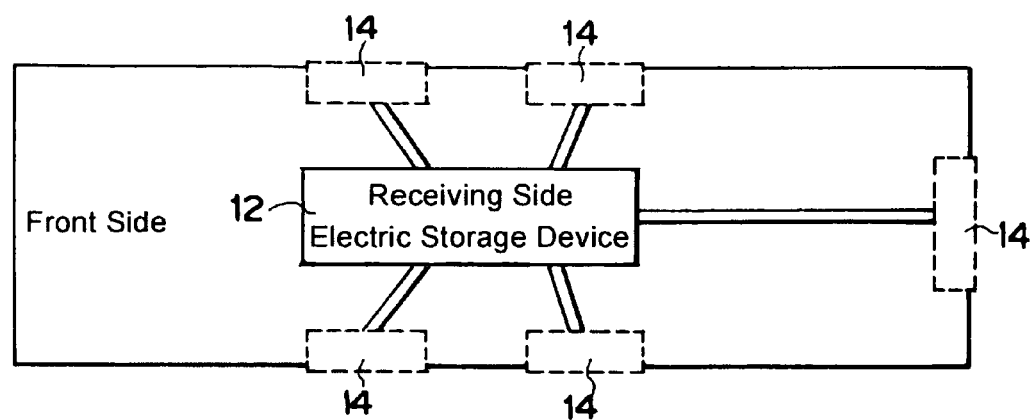
FIG. 3 is a schematic view showing an example of arrangement of a receiving side coil and a receiving side electric storage device in the vehicle.
Figure 4:
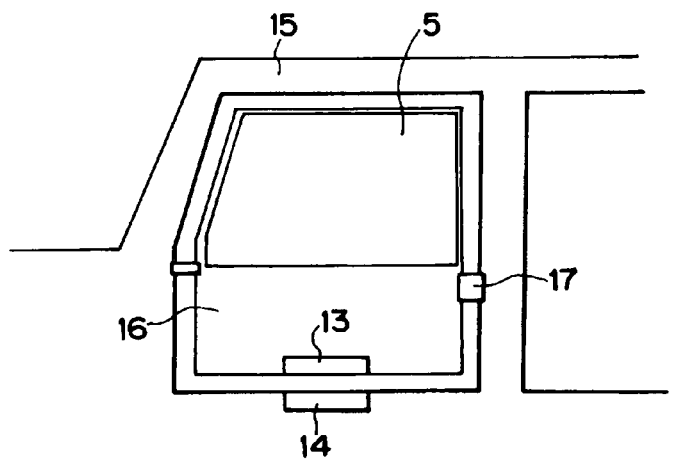
FIG. 4 is a view schematically showing a configuration of a front door of the vehicle.

The electric generation system of the present invention can be applied to various equipments and devices receiving solar light. Especially, the electric generation system of the invention is capable of improving fuel consumption and gas emission if it is applied to an automobile. Accordingly, an example of applying the present invention to a vehicle will be explained hereinafter. One example of a vehicle 1 is shown in FIGS. 2, 3 and 4. The vehicle 1 illustrated therein is a so-called 1 box car having five doors including a pair of front doors 2, a pair of sliding rear doors 3 situated in the rear of the front doors 2, and a hatch-back door 4 of the rear end. The doors 2, 3 and 4 are provided individually with a glass window 5 corresponding to a transparent plate of the invention. The glass window 5 is also provided in front of front sheets, and also provided as a part of a sunroof.

Figure 1:
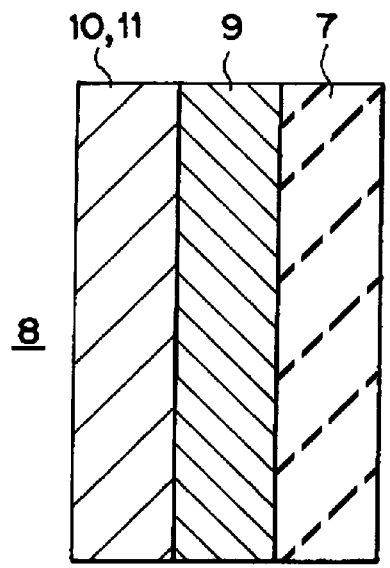
FIG. 1 is a sectional view schematically showing one example of a glass window comprising a photochromic module and a generation module used in an electric generation system of the invention.

Those glass windows 5 have functions to control an amount of light transmitting therethrough and to generate electric power, in addition to a role of dividing a vehicle interior from an exterior space. One example of the glass window 5 having a three-layer structure is shown schematically in FIG. 1. As shown in FIG. 1, a photochromic module 9 corresponding to a photochromic material of the invention is arranged on one of the faces of a glass 7 facing to a vehicle interior 8. Here, a glass 7 is transmissive to at least visible rays. As a conventional light control grass, transparency of the photochromic module 9 is decreased by energizing the photochromic module 9, and an amount of light penetrating into the vehicle interior 8 from outside through the photochromic module 9 is thereby reduced. A form of the photochromic module 9 is thin plate-like or film-like shape, and the photochromic module 9 is laminated or attached to the face of the glass 7 facing to the vehicle interior 8. Here, light control grass, in which the transparency thereof is increased by energizing, may also be used as the photochromic module 9.

Also, a photovoltaic generation module 10 and a thermal generation module 11 are arranged on a side closest to the vehicle interior 8. Both of these modules 10 and 11 are formed into a thin plate-shape or film-like shape and endowed with a translucency. The photovoltaic generation module 10 is composed mainly of an n-type semiconductor and a p-type semiconductor, and adapted to generate an electromotive force by receiving light such as solar light. Namely, the photovoltaic generation module 10 is a transparent solar cell, in which a film electrode made of e.g., $TiO_2$, $ZnO$ and so on is formed on a face of a transparent glass or a synthetic resin such as PET (i.e., polyethylene terephthalate). Thus, a conventional solar cell can be used as the photovoltaic generation module 10.

On the other hand, the thermal generation module 11 is composed mainly of an n-type semiconductor and a p-type semiconductor, and adapted to generate an electromotive force according to a temperature difference between temperatures of top and bottom faces thereof, more specifically, by receiving thermal energy. The thermal generation module 11 can be manufactured by selecting a conventional material of an electrode and applying to a known TFT (Thin Film Transistor) technology.

Here, an order of laminating those modules 10 and 11 should not be limited to the illustrated example, but any one of those modules 10 and 11 may be situated on the glass 7 side. A composite structured module having a photovoltaic function as well as a thermal generating function may also be used. Additionally, the photovoltaic generation module 10 may also be composed mainly of an organic material.

An electric power generated by the generation modules 10 and 11 is stored in a receiving side electric storage device 12 mounted on the vehicle 1. A feeding side coil 13 and a receiving side coil 14 are used to supply the electric power to the receiving side electric storage device 12 from individual generation modules 10 and 11 of doors 2, 3 and 4. Specifically, as illustrated in FIG. 4, the feeding side coil 13 is individually arranged on a predetermined portion of the doors 2, 3 and 4, and connected to the generation modules 10 and 11. On the other hand, the receiving side coil 14 as a counterpart of the feeding side coil 13 is arranged on a body to be opposed to the feeding side coil 13. Here, in FIG. 4, reference numerals 15 represents an exterior panel, 16 represents a door panel and 17 represents a door lock mechanism.

Figure 5:
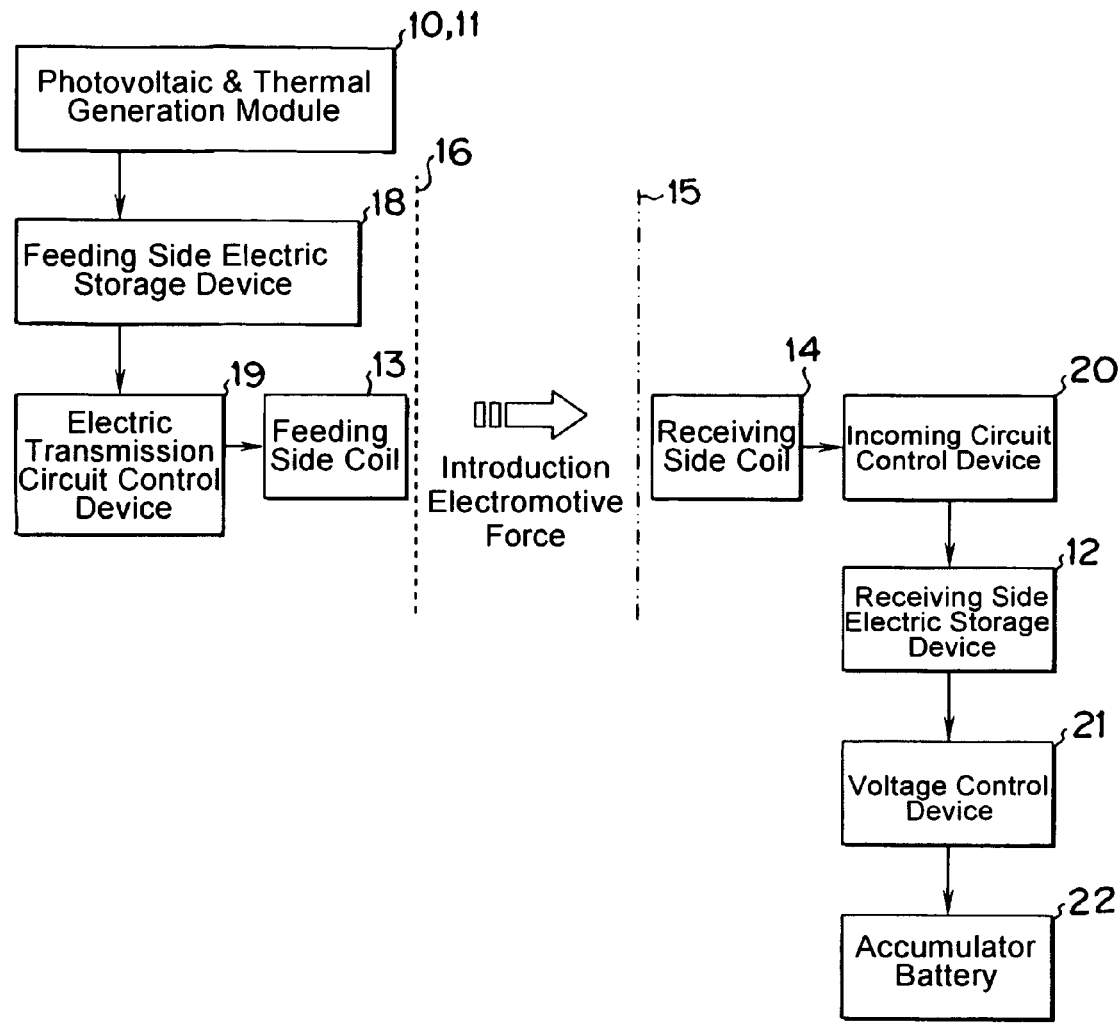
FIG. 5 is a block diagram showing one example of a feeding line and a control line from the generation module to the storage device.

FIG. 5 is a block diagram showing a control line of charging through the aforementioned coils 13 and 14. The doors 2, 3 and 4 are individually provided with a feeding side electric storage device 18 connected with the generation modules 10 and 11, and an electric transmission circuit control device 19 interposed between the feeding side electric storage device 18 and the feeding side coil 13. The feeding side electric storage device 18 is a secondary battery or a capacitor for temporarily storing the electric power generated by the generation modules 10 and 11. The electric transmission circuit control device 19 converts direct current outputted from the feeding side electric storage device 18 into alternate current and feeds the converted alternate current to the feeding side coil 13. Also, the electric transmission circuit control device 19 controls voltage and current according to need.

On the other hand, the receiving side coil 14 is connected to the receiving side electric storage device 12 through an incoming circuit control device 20. An induction electromotive force is generated on the receiving side coil 14 by applying the alternate current to the feeding side coil 13. Therefore, the incoming circuit control device 20 is adapted to convert the alternate current generated on the receiving side coil 14 into the direct current, and to charge the receiving side electric storage device 12 with the direct current by controlling voltage or current according to need. The receiving side electric storage device 12 may be a secondary battery or capacitor as the aforementioned feeding side electric storage device 18, and connected with an accumulator battery 22 through a voltage control device 21. A role of the voltage control device 21 is to regulate the voltage outputted from the receiving side electric storage device 12 to the voltage to charge the accumulator battery 22 therewith. The accumulator battery 22 functions as a general power source of the vehicle 1, and the electric power is supplied therefrom to electrical equipments such as a starter motor, a headlight, an interior light, a wiper motor and so on.

Accordingly, a need for providing a harness for feeding electric power between each door 2, 3 and 4 and the body, and a need for waterproofing and dust proofing by means of a grommet, can be eliminated by thus feeding electric power from the generation modules 10 and 11 of doors 2, 3 and 4 to the receiving side electric storage device 12 using the feeding side coil 13 and the receiving side coil 14. As a result, a weight of the vehicle can be reduced and an assembly of the vehicle can be simplified.

Figure 6:
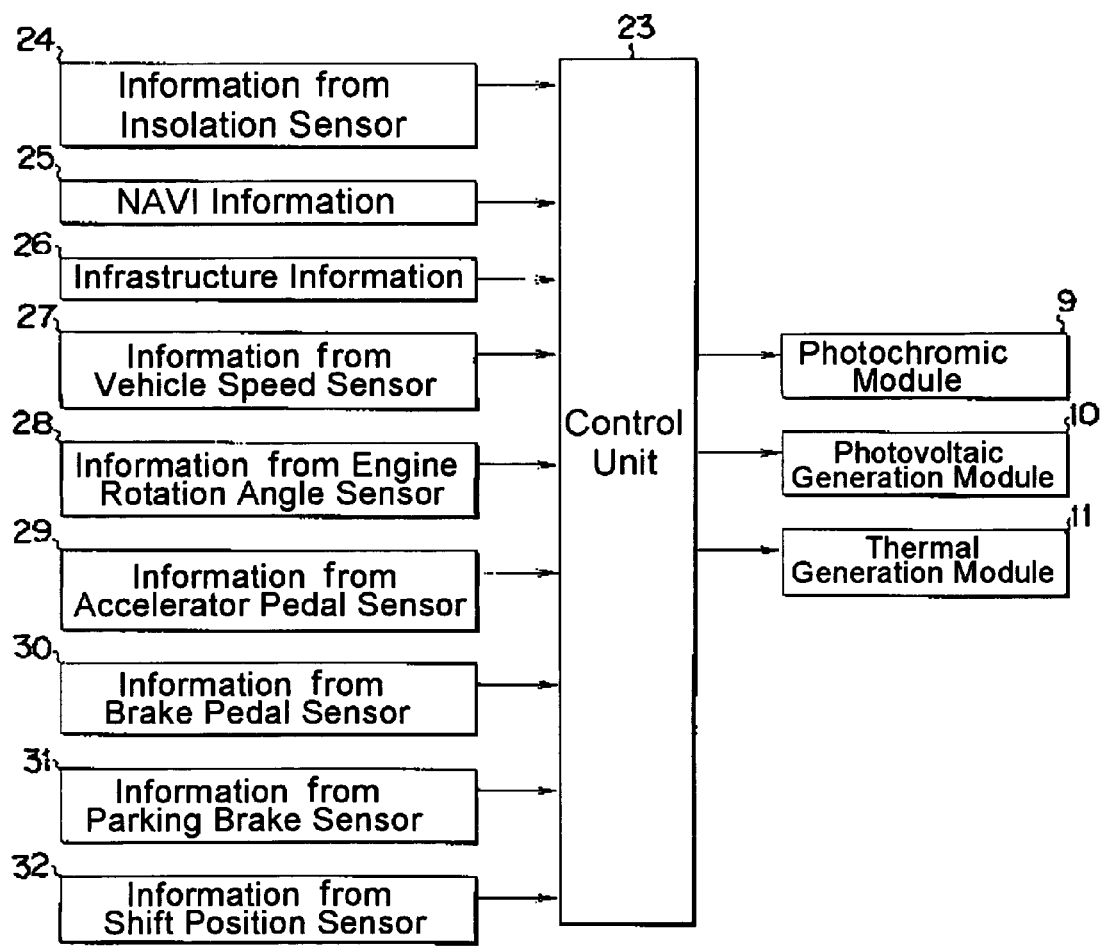
FIG. 6 is a block diagram showing information provided to the control unit controlling the photochromic module and individual generation modules in the vehicle.

In order to control an amount of light transmitting through the photochromic module 9, and to control generation amounts of the photovoltaic generation module 10 and the thermal generation module 11, there is provided a control unit 23. An overview of the control using the control unit 23 is shown in FIG. 6. The control unit 23 is composed mainly of a microcomputer. The control unit 23 carries out a calculation on the basis of information to be inputted and stored in advance, and outputs instruction signals to the individual modules 9, 10 and 11 on the basis of the calculation result.

For example, information from an insolation sensor 24, i.e., a detected value of an amount (or intensiveness) of solar light falling on the vehicle 1 is inputted to the control unit 23 as an information to be used for the calculation. Also, navigation information (NAVI) 25, and infrastructure information 26 are inputted to the control unit 23. The navigation information 25 is the information specifying a present location (i.e., latitude, longitude and altitude) of the vehicle 1 on an expected route to drive, which is obtained by an in-vehicle navigation system. The navigation information 25 includes information discriminating whether the vehicle 1 is climbing a hill or driving down a slope, whether the vehicle 1 is running on a local road or on a highway, whether the vehicle 1 is in an urban area or in a suburban area, whether the vehicle 1 is running on a straight road or a on a winding road and so on. Those information may be stored in advance in accordance with a map, otherwise, may also be received from an artificial satellite.

On the other hand, the infrastructure information 26 is a signal which is sent from a ground-based information distributing system such as a beacon or a signal post, and which can be received by a receiving system mounted on the vehicle 1 together with the navigation system. Specifically, the infrastructure information 26 is the information obtained by VICS (i.e., Vehicle Information & Communication System) or SSVS (i.e., Super Smart Vehicle System). The infrastructure information 26 includes information about traffic congestion, road construction, accumulation of snow, mudslide, swelling of a river, blockage of traffic, existence of fallen rock or tree, existence of stopping car at an intersection, existence of pedestrian or animals, indication of a traffic light at an oncoming intersection (i.e., red, yellow and green), indication of a signal and status of a crossing bar at an oncoming railroad crossing, time for the signal and crossing bar to change and so on.

In addition, information from a not shown vehicle speed sensor 27 detecting the speed of the vehicle 1, information from a not shown engine rotation angle sensor 28, information from a not shown accelerator pedal sensor 29, information from a not shown brake pedal sensor 30, information from a not shown parking brake sensor 31, information from a not shown shift position sensor 32 and so on are inputted to the control unit 23. A running condition of the vehicle 1, specifically, whether or not the vehicle 1 is stopping, whether or not the vehicle 1 is running forward, whether or not the vehicle 1 is accelerating, whether or not the vehicle 1 is decelerating and so on can be determined on the basis of the above-listed information.

Figure 7:
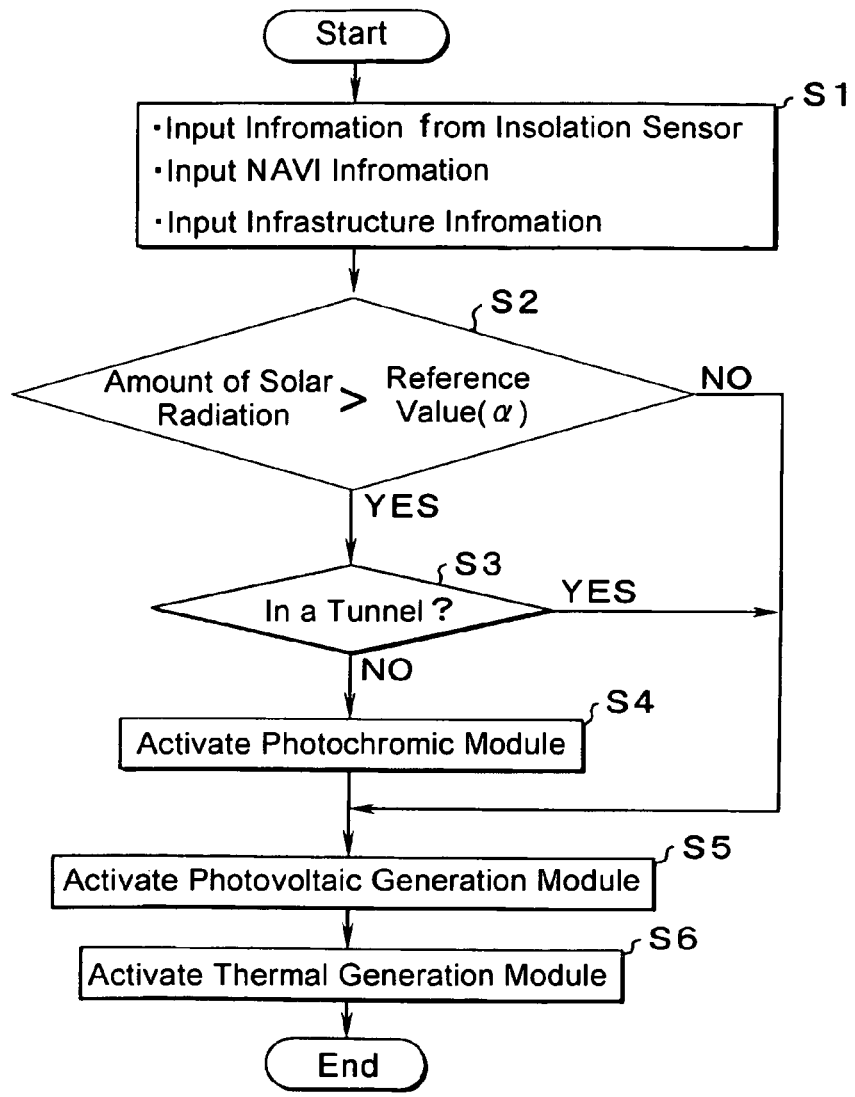
FIG. 7 is a flowchart showing a control example of controlling the photochromic module in the electric generation system of the invention based on an amount of solar radiation and existence of a tunnel.

The electric generation system of the present invention carries out an electric generation control to be explained hereinafter using the aforementioned control unit 23. FIG. 7 is a flowchart showing one example of the control. First of all, the information from the insolation sensor 24 and the navigation information 25 are inputted (at Step S1). Then, it is judged whether or not an amount of solar radiation is larger than a preset reference value α on the basis of the inputted information from the insolation sensor 24 (at Step S2). For example, the reference value α is set to a level of an amount of radiation before sundown under a clear weather. Therefore, the judgment at Step S2 may also be a judgment to determine whether or not the present time is a daytime, or whether or not the weather is clear, on the basis of other kinds of information.

In case the answer of Step S2 is YES, it is judged whether or not the vehicle 1 is running in a tunnel or entering into a tunnel (at Step S3). In other words, the judgment carried out at Step S3 is a judgment to determine whether or not the vehicle 1 is in the shade or going into the shade even if the radiation amount of solar light is large. The judgment at Step S3 can be carried out on the basis of the aforementioned navigation information 25.

In case the vehicle 1 is not running in the tunnel, namely, in case the vehicle 1 is not in the shade so that the answer of Step S3 is NO, the photochromic module 9 is activated (at Step S4). Specifically, an amount of light transmitting through the photochromic module 9 is reduced by applying a voltage thereto. As a result, the amount of the light entering into the vehicle interior 8 is reduced. Therefore, a cooling efficiency of the vehicle interior 8 is improved in case of cooling the vehicle interior 8. In this case, even if the amount of the light transmitting through the photochromic module 9 is reduced, sufficient solar radiation is falling onto the vehicle 1 so that brightness in the vehicle interior 8 can be ensured. This means that the visibility through the glass window 5 will not be degraded.

Then, the photovoltaic generation module 10 is activated to carry out a photovoltaic generation (at Step S5). The photovoltaic generation module 10 generates an electromotive force by receiving the light reduced by the photochromic module 9. Therefore, the generation amount of the photovoltaic generation module 10 is lowered but a calorific value thereof is also lowered. For this reason, deterioration in power generation efficiency of the photovoltaic generation module 10 as well as deterioration in its durability can be avoided by suppressing temperature rise thereof.

Subsequently, the thermal generation module 11 is activated (at Step S6). Temperature of one of the faces of the thermal generation module 11 facing to the photochromic module 9 is raised relatively as a result of receiving heat rays in the solar light such as infrared ray. Additionally, the heat resulting from blocking a part of incoming radiation by the photochromic module 9 is also transmitted to said face of the thermal generation module 11 facing to the photochromic module 9. As a result, a difference between the temperatures of both faces of the thermal generation module 11, i.e., a difference between the temperature of the face facing to the photochromic module 9 and the temperature of the face facing to the vehicle interior 8 becomes wider. That is, since the thermal generation is performed according to the temperature difference, the thermal generation efficiency is improved or a production amount of the thermal generation is increased. This means that the heat resulting from blocking a part of incoming radiation by the photochromic module 9 can be utilized for generating electric power.

To the contrary, the amount of solar radiation is smaller than the preset reference value α so that the answer of Step S2 is NO, the routine advances immediately to Steps S5 and S6 to carry out photovoltaic and thermal generation without activating the photochromic module 9. In this case, since the amount of light transmitting through the glass window 5 is relatively large, the visibility will not be degraded. Moreover, because the photochromic module 9 does not block the light, the temperature thereof will not especially be raised. However, in this case, the amount of the light reaches the photovoltaic generation module 10 is relatively increased. For this reason, production amount of the photovoltaic generation can be enhanced and deterioration in a recovery rate of solar energy can be prevented or avoided.

The control example thus far explained is the example to activate and inactivate the photochromic module 9. However, according to the present invention, the amount of light transmitting through the photochromic module 9, in other word, a light transmission rate of the photochromic module 9 may also be changed into a plural pattern in accordance with the running condition (or environment) of the vehicle 1. An example thereof is shown in a flowchart of FIG. 8. According to this control example, the information listed in FIG. 6 is inputted first of all (at Step S11). Specifically, the information from the insolation sensor 24, the navigation information 25, the infrastructure information 26, the information from the vehicle speed sensor 27, the information from the engine rotation angle sensor 28, the information from the accelerator pedal sensor 29, the information from the brake pedal sensor 30, the information from the parking brake sensor 31, and the information from the shift position sensor 32 are inputted at Step S11. Then, it is judged whether or not the vehicle 1 is stopping on the basis of the information from the vehicle speed sensor 27 (at Step S12).

In case the speed of the vehicle 1 is higher than the preset value so that the answer of Step S12 is NO, it is judged whether or not R (reverse) position setting a reverse gear stage is selected (at Step S13). In case the answer of Step S13 is NO, a light transmission rate I of the photochromic module 9 is calculated (at Step S14). For example, the light transmission rate I can be calculated on the basis of a map. Examples of the maps are shown in FIGS. 9 and 10.

Figure 9:
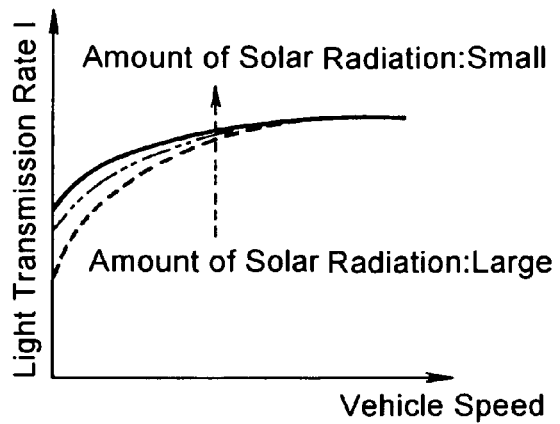
FIG. 9 shows an example of a map for calculating transmission factors of a windshield and glass windows of the front doors in case the vehicle runs forward.

FIG. 9 shows a map for calculating the light transmission rate I of the photochromic modules 9 in a windshield and glass windows of the front doors. According to the map shown in FIG. 9, the vehicle speed and the amount of solar radiation are used as parameters to calculate the light transmission rate I. The light transmission rate I is increased according to speedup of the vehicle and reduction in the amount of solar radiation. An objective of such setting is to ensure the visibility by allowing easy transmission of the light in case the amount of solar radiation is small, and to promote the photovoltaic generation.

Figure 10:
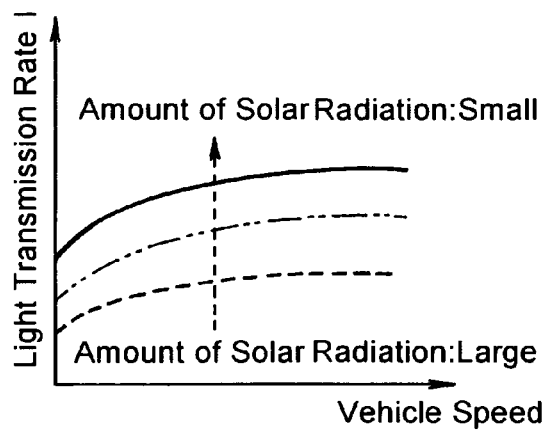
FIG. 10 shows an example of a map for calculating transmission factors of a glass window of a hatch back door and rear window glasses in case the vehicle runs forward.

On the other hand, FIG. 10 shows a map to evaluate the light transmission rate I of the photochromic modules 9 in glass windows of rear doors and a hatchback door. In FIG. 10, the light transmission rate I is set entirely lower than that shown in the map of FIG. 9. This is because only a certain level of visibility is required for the windows of the rear door and the hatchback doors, unlike the windshield and the windows of the front doors. Additionally, the reason for such setting is to improve cooling efficiency by reducing the heat entering into the vehicle 1, and to increase the production amount of thermal generation.

Figure 8:
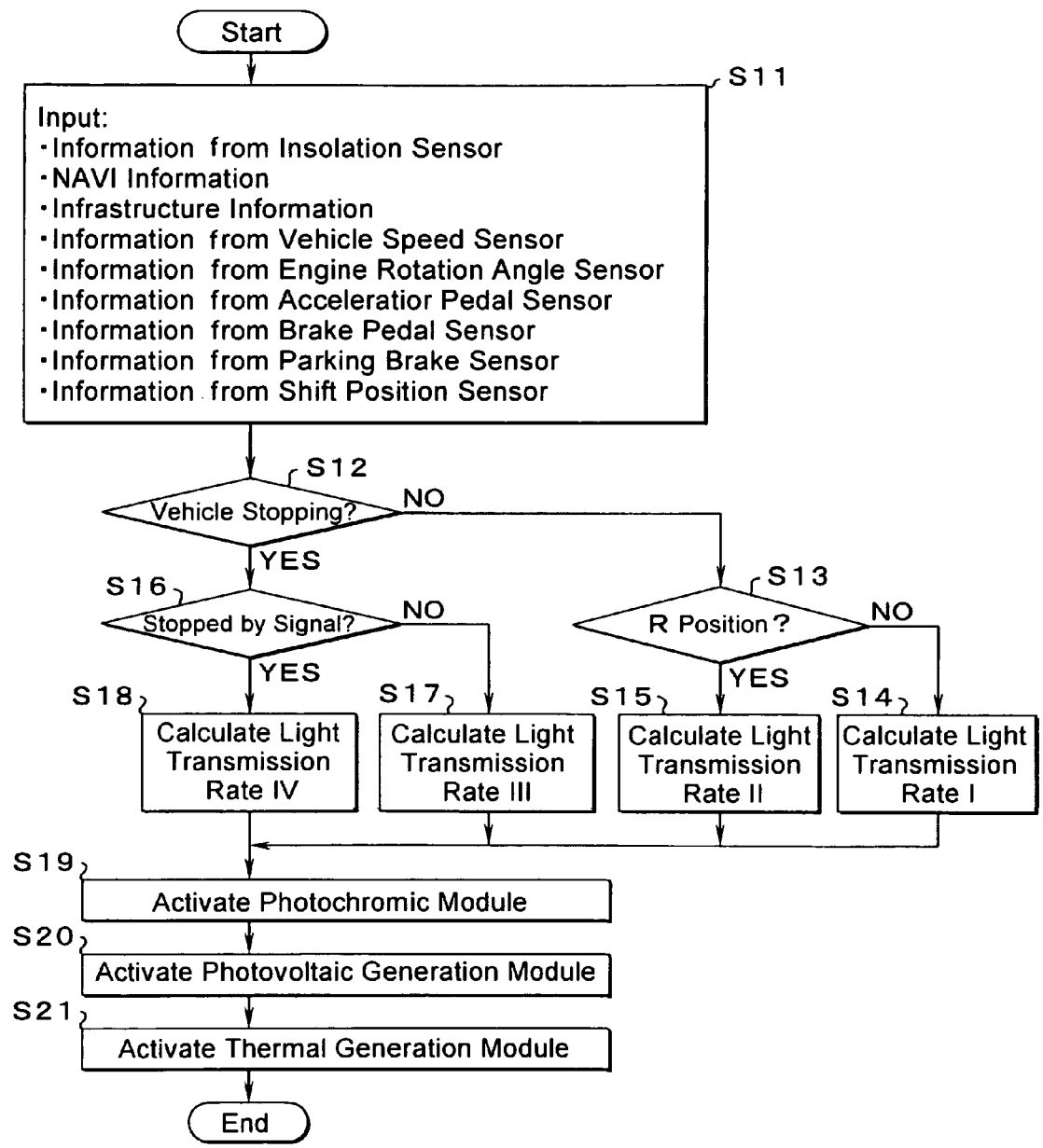
FIG. 8 is a flowchart showing a control example of setting a transmission factor of the photochromic module in the electric generation system of the invention into a plural pattern based on a running condition or running environment of the vehicle.
Figure 11:
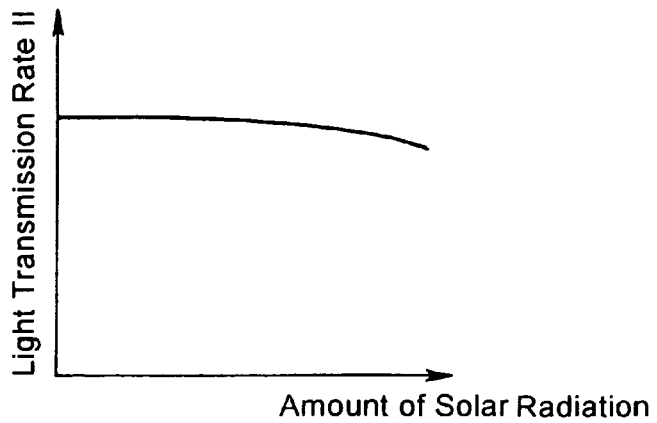
FIG. 11 shows an example of a map for calculating transmission factor in case the vehicle runs backward.

In case the answer of Step S13 shown in FIG. 8 is YES, specifically, in case R position is selected to drive the vehicle 1 backwardly, or in case the vehicle 1 is running backward, a light transmission rate II is calculated (at Step S15). FIG. 11 shows one example of a map for calculating the light transmission rate II for all of the glasses 5. According to the map shown in FIG. 11, the light transmission rate II is decreased slightly according to the rise in the amount of solar radiation. In case of driving the vehicle backwardly, it is necessary to ensure the visibility for all of the windows. For this purpose, the light transmission rate II in the map of FIG. 11 is set larger to allow easy transmission of the light.

In case the vehicle 1 is stopped so that the answer of Step S12 is YES, it is judged whether or not the vehicle 1 stops at a traffic light on the basis of the navigation information 25 and the infrastructure information 26 (at Step S16). That is, the judgment at Step S16 is carried out to determine how the vehicle 1 is stopping. More specifically, at Step S16, it is judged that the vehicle 1 is stopping temporarily or stopping for a certain amount of time. Therefore, for example, the judgment at Step S16 may be executed based on the signal from the parking brake sensor 31, or on the information about traffic congestion as one of the contents of the infrastructure information 26.

Figure 12:
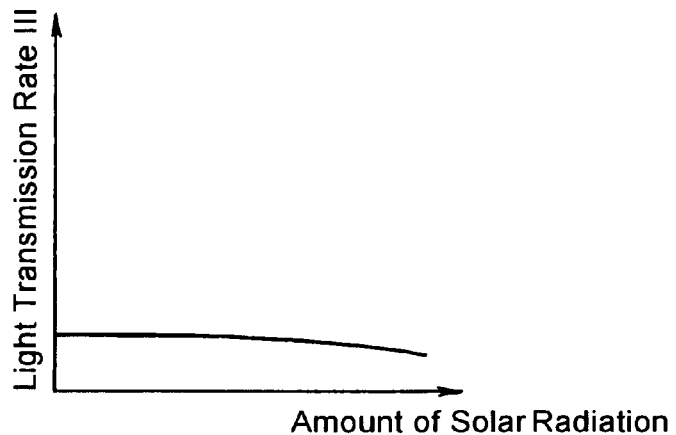
FIG. 12 shows an example of a map for calculating transmission factor in case the vehicle stops except for the case in which the vehicle is stopped by a traffic light.

In case the answer of Step S16 is NO, specifically, in case the vehicle 1 is not stopping temporarily at a signal light and will not run for a certain amount of time, a light transmission rate III is calculated (at Step S17). FIG. 12 shows one example of a map for calculating the transmission rate III. As the aforementioned map shown in FIG. 11, the amount of solar radiation is also employed as a parameter in FIG. 12, and the transmission rate III is decreased slightly according to a rise in the amount of solar radiation. However, the light transmission rate III is set significantly lower than the light transmission rate II in FIG. 11 for the case in which R position is selected. The reason for such setting is that it is not necessary to ensure high visibility and it is necessary to suppress temperature rise in the vehicle interior 8 as low as possible, in case the vehicle 1 is stopping for a certain amount of time.

Figure 13:
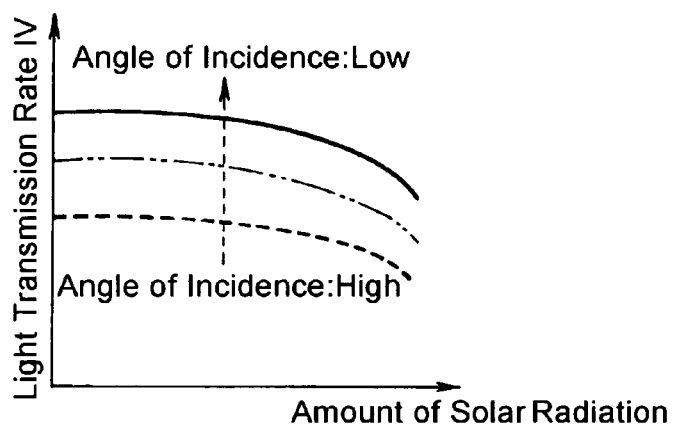
FIG. 13 shows an example of a map for calculating transmission factors of the windshield and the glass windows of the front door in case the vehicle is stopped by a traffic light.
Figure 14:
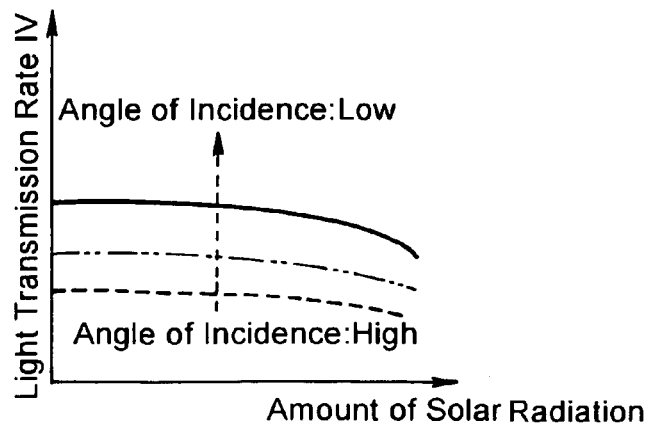
FIG. 14 shows an example of a map for calculating transmission factors of the glass window of the hatch back door and the rear window glasses in case the vehicle is stopped by a traffic light.

To the contrary, in case the vehicle 1 is stopped temporarily by a stop signal so that the answer of Step S16 is YES, a light transmission rate IV is calculated (at Step S18). As in the aforementioned case of driving the vehicle 1 in the forward direction, a map for the windshield and the windows of the front doors as shown in FIG. 13, and a map for the windows of the rear doors and the hatchback doors as shown in FIG. 14 are individually prepared. At Step S18, the light transmission rate IV is calculated on the basis of those maps. In the maps shown in FIGS. 13 and 14, an amount of solar radiation and an angle of incidence (e.g., solar altitude) are used as parameters for setting the light transmission rate IV. As can be seen from FIGS. 13 and 14, the light transmission rate IV is decreased according to a rise in the amount of solar radiation, and according to an approximation of the incidence angle with respect to the window 5 to a right angle. The reason for such setting is that it is necessary to improve the cooling efficiency by reducing an amount of solar radiation entering into the vehicle interior 8 in case the amount of solar radiation is large, and that the possibility of deterioration in the visibility is rather low even if the light transmission rate IV is low. Additionally, since the light amount per unit area is large in case the incidence angle with respect to the window 5 is close to a right angle, the light transmission rate IV is set to a relatively low rate as in the case in which the amount of solar light is large.

After calculating the light transmission rates of the photochromic module 9 on the basis of running condition of the vehicle 1 or environment therearound as thus far explained, the photochromic module 9 is activated in accordance with the calculated light transmission rates (at Step S19). Then, as in the control example shown in FIG. 7, the photovoltaic generation module 10 is activated (at Step S20), and the thermal generation module 11 is activated (at Step S21).

As a result of carrying out the control shown in FIG. 8, the amount of light transmitting through the photochromic module 9, i.e., the visibility through the glass window 5 can be appropriately set or adjusted in accordance with the actual running condition of the vehicle 1 and the environment therearound. Therefore, the cooling efficiency in the vehicle 1 can be improved by controlling the amount of the light entering into the vehicle interior 8 without degrading the visibility. Moreover, the proportion of the thermal generation to the photovoltaic generation can be set appropriately in accordance with the actual running condition of the vehicle 1 and the environment therearound when carrying out those generations. As a result, the energy efficiency as well as the recovery efficiency of the solar energy can be improved entirely.

As explained above, the light transmission rate of the glass window 5 affects not only the efficiency of the thermal generation, efficiency of the photovoltaic generation and the visibility, but also the temperatures of the generation modules 10 and 11. Specifically, if the light transmission rate is lowered in case the solar light is radiating amply, the heat accumulates on the glass window 5 so that the temperatures of the generation modules 10 and 11 are raised. However, if the temperatures are raised excessively, generation efficiency of the photovoltaic generation module 10 is especially degraded. In order to avoid such a problem, according to the present invention, the light transmission rate of the glass window 5 can also be set in accordance with the temperatures of the generation modules 10 and 11 instead of the running condition of the vehicle 1.

Figure 15:
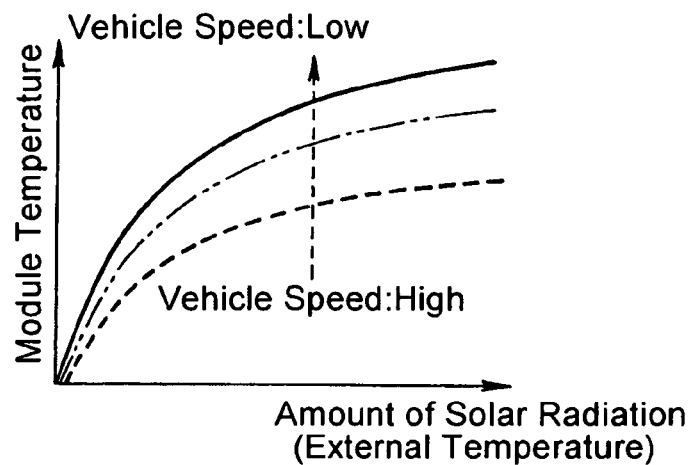
FIG. 15 shows an example of a map for estimating a module temperature.

Specifically, temperatures of the generation modules 10 and 11, or a temperature of the glass window 5 to which the generation modules 10 and 11 are attached is/are detected first of all. This detection of the temperature may be carried out by arranging a (not shown) temperature sensor in the generation modules 10 and 11, or in the glass window 5. Alternatively, the temperature may also be estimated from the amount of the solar radiation or an external temperature and a speed of the vehicle 1. FIG. 15 shows one example of a map to be used for estimating a module temperature based on an amount of the solar radiation or an external temperature, and a speed of the vehicle 1. As can be seen from FIG. 15, the module temperature is estimated as a higher temperature in accordance with the rise in the amount of the solar radiation or the external temperature, and with a reduction in the vehicle speed.

Figure 16:
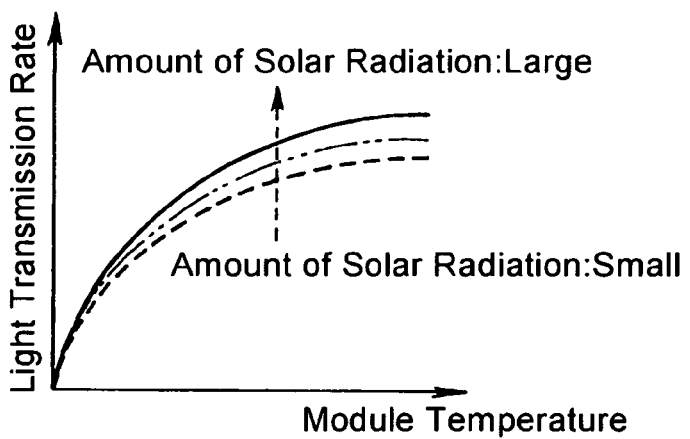
FIG. 16 shows an example of a map for setting transmission factor based on the module temperature.

After the temperature of the generation modules 10 and 11 or the glass window 5 is detected, the light transmission rate of the glass window 5 is set on the basis of the detected temperature. Specifically, the light transmission rate is set to a higher rate in case the module temperature is high, in comparison with the case in which the module temperature is low. FIG. 16 shows one example of a map to be used for setting the light transmission rate of the glass window 5. As can be seen from FIG. 16, the light transmission rate, in other words, an amount of light transmitting through the glass window 5, is set to a higher rate in accordance with the rise in the module temperature and the amount of the solar radiation.

Thus, the solar light is allowed to transmit easily through the glass window 5 in case the temperature of the generation modules 10 and 11 or the glass window 5 is high or getting higher. This means that it is difficult for the heat to accumulate on the glass window 5. For this reason, temperature rise in the generation modules 10 and 11 is suppressed. As a result, electric generation can be carried out efficiently by the generation modules. Here, a means for controlling the amount of light transmitting through the window 5 in such a way on the basis of the module temperature corresponds to a means for increasing an amount of light transmitting through the photochromic material of the invention.

Moreover, the photovoltaic generation module 10 and the thermal generation module 11 are arranged in a heat transmittable manner. Therefore, the excessive temperature rise in the photovoltaic generation module 10 can be suppressed by lowering the light transmission rate to suppress a production amount of the photovoltaic generation, in case the amount of solar radiation is large. As a result, deterioration in the power generation efficiency of the photovoltaic generation module 10 can be prevented, and durability thereof can be improved. On the other hand, since the thermal generation module 11 converts the heat of the photovoltaic generation module 10 into electric power, the recovery efficiency of the solar energy can be further improved.

Figure 17:
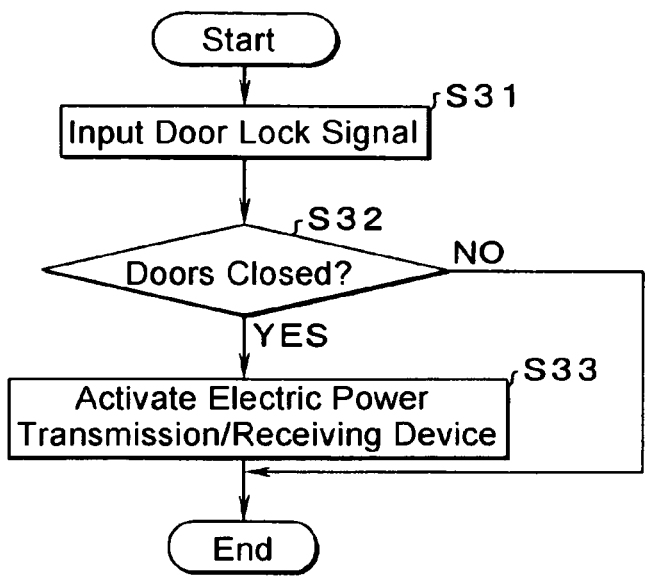
FIG. 17 is a flowchart showing a control example of supplying electric power from a feeding side coil to the receiving side coil.

As explained above, according to the electric generation system of the invention, the electric power is supplied from the door side to the body side using the feeding side coil 13 and the receiving side coil 14. Therefore, in order to improve electrical transmission efficiency, it is preferable to carry out a control shown in FIG. 17. In FIG. 17, a door lock signal from the aforementioned door lock mechanism is inputted first of all (at step S31). Then, it is judged whether or not the doors 2, 3 and 4 are closed on the basis of the door lock signal (at Step S32).

In case the answer of Step S32 is NO, this routine is ended without carrying out any especial control. To the contrary, in case the answer of Step S32 is YES, electric power transmission/receiving devices of the closing doors 2, 3 and 4 are activated (at Step S33). Specifically, the electric power is transmitted between the feeding side coils 13 and the receiving side coils 14 of the doors 2, 3 and 4 by generating an electromagnetic induction therebetween. Thus, the electric power can be transmitted between the coils 13 and 14 in a shortest distance, and power loss during the power transmission is thereby minimized.

Figure 18:
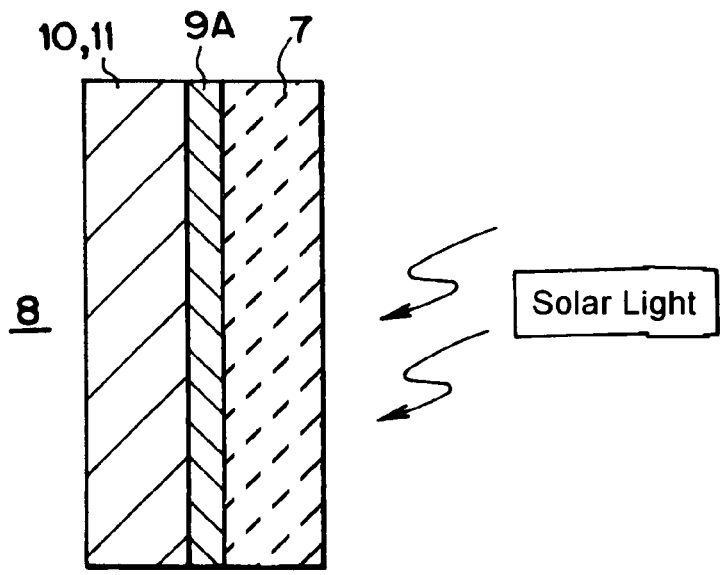
FIG. 18 is a sectional view schematically showing another example of the glass window comprising a photochromic module and a generation module used in the electric generation system of the invention.

Here, according to the invention, types of the photochromic material, and an arrangement of the photochromic material, the glass, and the generation module may be changed arbitrarily. Examples thereof will be explained hereinafter. FIG. 18 shows an example in which a heat ray reflecting photochromic module 9A is attached to the glass 7 on a face of the vehicle interior 8 side (an inner face hereinafter), and the thermal generation module 11 and the photovoltaic generation module 10 are attached to an inner face of the photochromic module 9A. According to this configuration, in case of reducing the amount of light transmitting through the photochromic module 9A relatively by increasing a reflectance ratio thereof, the heat is concentrated on the photochromic module 9A and the glass 7. As a result, the electric power generation efficiency of the thermal generation module 11 can be improved utilizing the concentrated heat.

Figure 19:
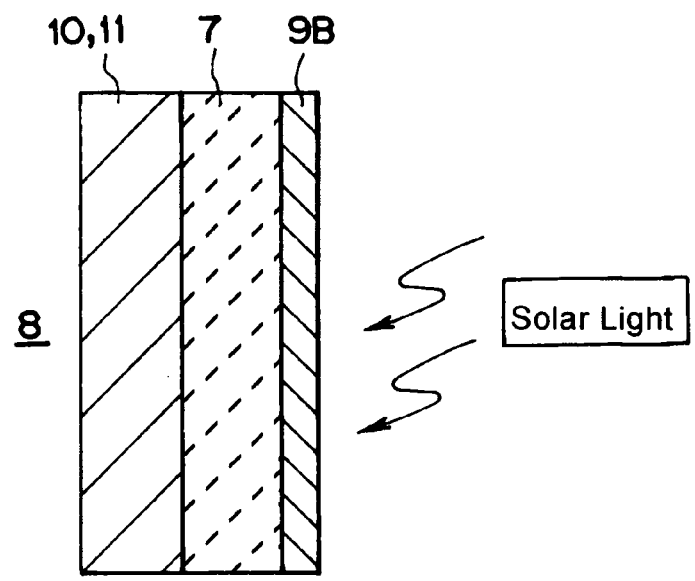
FIG. 19 is a sectional view schematically showing still another example of the glass window comprising a photochromic module and a generation module used in the electric generation system of the invention.

FIG. 19 shows an example in which the thermal generation module 11 and the photovoltaic generation module 10 are attached to an inner face of the glass 7, and a heat absorbing photochromic module 9B is attached to an outer face of the glass 7. According to this configuration, in case of reducing the amount of light transmitting through the photochromic module 9B relatively by increasing an absorption rate thereof, the heat is accumulated on the photochromic module 9B and the glass 7. As a result, the electric power generation efficiency of the thermal generation module 11 can be improved utilizing the accumulated heat.

Figure 20:
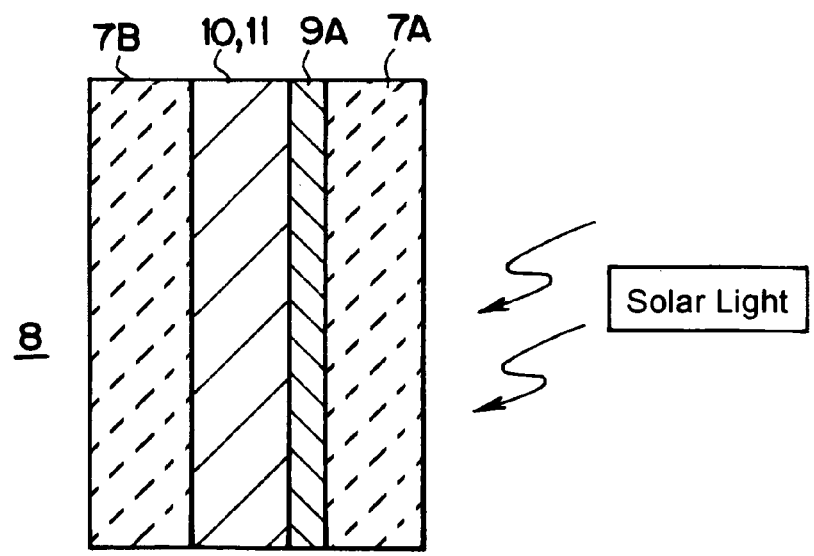
FIG. 20 is a sectional view schematically showing still another example of the glass window comprising a photochromic module and a generation module used in the electric generation system of the invention.

FIG. 20 shows an example of laminated glass structure. Specifically, the heat reflecting photochromic module 9A is attached to an inner face of an outer glass 7A, and the photovoltaic generation module 10 and the thermal generation module 11 are sandwiched between the photochromic module 9A and an inner glass 7B. In other words, the inner glass 7B is added to the configuration illustrated in FIG. 18 in the vehicle interior 8 side. Accordingly, the electric power generation efficiency of the thermal generation module 11 can be improved as the example shown in FIG. 18.

Figure 21:
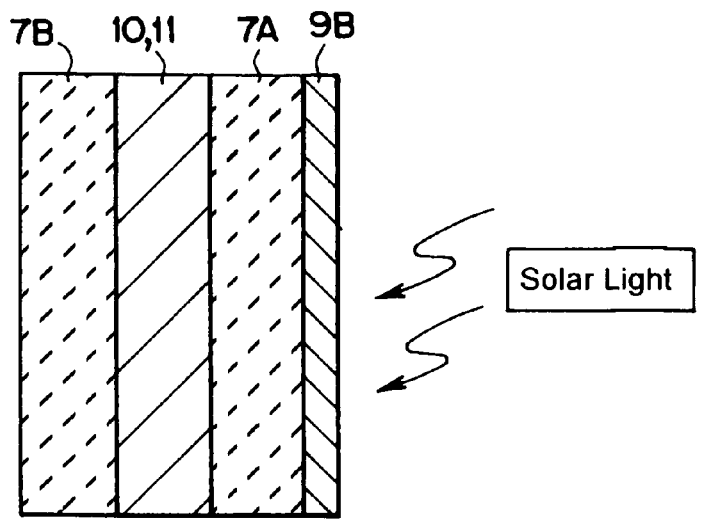
FIG. 21 is a sectional view schematically showing still another example of the glass window comprising a photochromic module and a generation module used in the electric generation system of the invention.

FIG. 21 also shows an example of laminated glass structure. Specifically, the heat absorbing photochromic module 9B is attached to the outer face of the outer glass 7A, the thermal generation module 11 and the photovoltaic generation module 10 are attached to the inner face of the outer glass 7A, and the inner glass 7B is arranged on the inner face of the thermal generation module 11 and the photovoltaic generation module 10. In other words, the inner glass 7B is added to the configuration illustrated in FIG. 19 in the vehicle interior 8 side. Accordingly, the electric power generation efficiency of the thermal generation module 11 can be improved as the example shown in FIG. 19.

Figure 22:
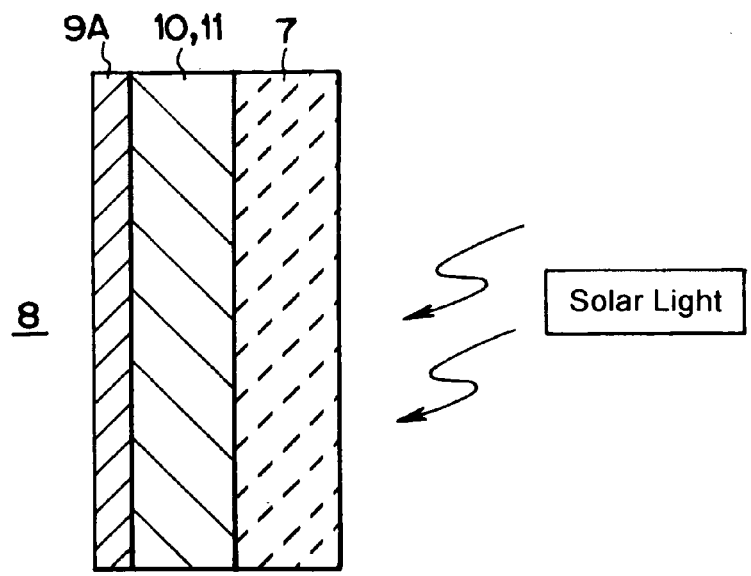
FIG. 22 is a sectional view schematically showing still another example of the glass window comprising a photochromic module and a generation module used in the electric generation system of the invention.
Figure 23:
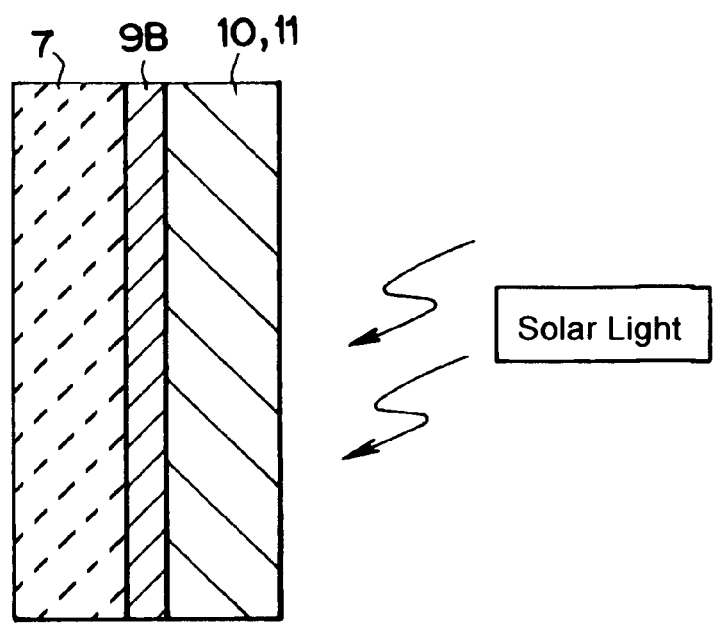
FIG. 23 is a sectional view schematically showing still another example of the glass window comprising a photochromic module and a generation module used in the electric generation system of the invention.

Further, FIG. 22 shows an example, in which the photovoltaic generation module 10 and the thermal generation module 11 are attached to the inner face of the glass 7, and the heat reflecting photochromic module 9A is attached to the inner face of generation modules 10 and 11. Also, FIG. 23 shows an example, in which the heat absorbing photochromic module 9B is attached to the outer face of the glass 7, and the photo-voltaic generation module 10 and the thermal generation module 11 are attached to the outer face of the photochromic module 9B. In these configurations, the temperature of the photochromic module 9 may be raised by heat generated as a result of controlling the light by absorbing heat rays. Consequently, the temperature of the thermal generation module 11 is raised in the vehicle interior 8 side higher than that in the side closer to the vehicle exterior. In the wintertime, the external temperature is especially low so that the difference between the temperatures in the vehicle interior 8 side and in the vehicle exterior side becomes wider. Therefore, the thermal generation module 11 generates electric power effectively utilizing the temperature difference (i.e., thermal energy) resulting from such a light control, in addition to the difference between the external temperature and the temperature in the vehicle interior 8. As a result, the electric power generation efficiency of the thermal generation module 11 is improved.

Here, this invention should not be limited to the specific examples thus far explained. Specifically, a shifting mode for selecting a range of speed change ratios of the vehicle 1 may also be employed as information indicating a running condition of the vehicle 1. For example, the present invention may also be adapted not to carry out the control to reduce the light transmission amount in case a snow mode, in which a speed change ratio to start moving the vehicle 1 is smaller than the maximum speed change ratio is selected, and to carry out any of aforementioned controls in case the shift mode other than the snow mode is selected. Further, the present invention may be applied to stationary facilities such as a sun room, a conservatory and so on. Additionally, the present invention also includes a configuration in which only a thermal generation module is attached to a glass.

The invention claimed is:

1. An electric generation system for generating an electric power utilizing solar energy falling on a transparent plate dividing a predetermined interior space from an exterior space, wherein:

the transparent plate includes an interior side and an exterior side, from which the solar energy enters;

the interior side of the transparent plate is in direct contact with a thin plate-like or film-like light control material capable of changing an amount of light transmitting therethrough; and an internal face of the light control material is in direct contact with a thin plate-like or film-like thermal generation module, which is transmissive to at least a portion of visible rays in the solar energy, and which generates an electromotive force according to a temperature difference between a temperature of a first face of the thermal generation module and a temperature of a second face of the thermal generation module;

wherein the first face of the thermal generation module is in direct contact with the internal face of the light control material and the second face of the thermal generation module is opposite the first face;

wherein the light control material is configure such that the light control material is heated by a voltage from the thermal generation module to reduce the amount of light transmitting through the light control material; and wherein the thermal generation module generates electric energy according to a difference between a temperature of the first face of the thermal generation module heated by the heat transmitted from the light control material and a temperature of the second face facing toward the interior lace.

2. The electric generation system as claimed in claim 1, further comprising:
   a control means that reduces the amount of light transmitting through the light control material in case an amount of the visible rays is large, in comparison with the case in which the amount of the visible rays is small.

3. The electric generation system as claimed in claim 2, wherein:
   the light control material includes a light control glass capable of controlling a rate of heat ray absorption, and
   the control means is adapted to reduce the amount of light transmitting through the light control material by increasing the rate of heat ray absorption.

4. The electric generation system as claimed in claim 2, wherein:
   the light control material includes a light control glass as a light reflection layer, in which a reflectance against the heat rays is controllable; and
   the control means is adapted to reduce the amount of light transmitting through the light control material by increasing the reflectance against heat ray.

5. The electric generation system as claimed in claim 1, wherein:
   the transparent plate further comprises a thin platelike or film-like photovoltaic generation module generating an electromotive force by a photoelectric conversion achieved by receiving solar light.

6. The electric generation system as claimed in claim 5, wherein:
   the photovoltaic generation module is connected with the light control material in a heat transmittable manner.

7. The electric generation system as claimed in claim 6, further comprising:
   a means that increases an amount of light transmitting through the light control material in case a temperature of the photovoltaic generation module is high, in comparison with the case in which the temperature of the photovoltaic generation module is low.

8. The electric generation system as claimed in claim 5, wherein:
   the photovoltaic generation module is arranged on the second face of the thermal generation module.

9. The electric generation system as claimed in claim 7, wherein:
   the photovoltaic generation module is arranged on the second face of the thermal generation module.

10. The electric generation system as claimed in claim 5, wherein the thermal generation module is integrated with the photovoltaic generation module.

11. The electric generation system as claimed in claim 1, further comprising a battery and electrical equipment;
    wherein the battery is configured to store the electric power generated by the thermal generation module and supply the generated electric power to the electrical equipment.

12. The electric generation system as claimed in claim 5, further comprising a battery and electrical equipment;
    wherein the battery is configured to store the electric power generated by the photovoltaic generation module and the thermal generation module and supply the generated electric power to the electrical equipment.

\* \* \* \* \*